United States Patent
Black

(10) Patent No.: US 8,415,758 B2
(45) Date of Patent: *Apr. 9, 2013

(54) OPTOELECTRONIC DEVICES UTILIZING MATERIALS HAVING ENHANCED ELECTRONIC TRANSITIONS

(75) Inventor: Marcie R. Black, Lincoln, MA (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/032,076

(22) Filed: Feb. 22, 2011

(65) Prior Publication Data

US 2011/0278534 A1 Nov. 17, 2011

Related U.S. Application Data

(63) Continuation of application No. 11/712,128, filed on Feb. 27, 2007, now Pat. No. 7,893,512.

(60) Provisional application No. 60/777,131, filed on Feb. 27, 2006.

(51) Int. Cl.
*H01L 27/14* (2006.01)

(52) U.S. Cl.
USPC .............. 257/431; 257/466; 977/762; 438/57

(58) Field of Classification Search .............. 257/9, 14, 257/15, 431, 466; 136/261; 438/57; 977/762
See application file for complete search history.

(56) References Cited

U.S. PATENT DOCUMENTS

| 5,851,310 | A | 12/1998 | Freundlich et al. |
| 6,444,897 | B1 | 9/2002 | Luque-Lopez et al. |
| 7,307,271 | B2 * | 12/2007 | Islam et al. ................ 257/14 |
| 2003/0168964 | A1 | 9/2003 | Chen |
| 2003/0189202 | A1 | 10/2003 | Li et al. |
| 2005/0024790 | A1 | 2/2005 | Pinarbasi |
| 2005/0196707 | A1 | 9/2005 | Cok |
| 2005/0227391 | A1 | 10/2005 | Jin et al. |
| 2006/0097389 | A1 | 5/2006 | Islam et al. |
| 2006/0207647 | A1 * | 9/2006 | Tsakalakos et al. ......... 136/256 |

FOREIGN PATENT DOCUMENTS

| EP | 0892444 | 1/1999 |
| EP | 1703569 A2 | 9/2006 |
| JP | 07272651 A | 3/1994 |
| WO | WO-2008/063209 | 5/2008 |

OTHER PUBLICATIONS

Xinyuan Zhao, C. M. Wei, L. Yang, and M. Y. Chou, Quantum Confinement and Electronic Properties of Silicon Nanowires, Phys. Rev. Lett. 92, 236805 (2004).*

Kuiqing Peng, Ying Xu, Yin Wu, Yunjie Yan, Shuit-Tong Lee, Jing Zhu, Aligned Single-Crystalline Si Nanowire Arrays for Photovoltaic Applications, vol. 1, Issue 11, pp. 1062-1067, Nov. 2005.*

(Continued)

*Primary Examiner* — Jenny L Wagner
*Assistant Examiner* — Mark Tornow
(74) *Attorney, Agent, or Firm* — Wilmer Cutler Pickering Hale and Dorr LLP

(57) ABSTRACT

An optoelectronic device that includes a material having enhanced electronic transitions. The electronic transitions are enhanced by mixing electronic states at an interface. The interface may be formed by a nano-well, a nano-dot, or a nano-wire.

19 Claims, 4 Drawing Sheets a        b        c 110        120        130

OTHER PUBLICATIONS

H. Scheel, S. Reich, and C. Thomsen, Electronic band structure of high-index silicon nanowires, Phys. Stat. Sol. (b) 242, No. 12, 2474-2479 (2005).*

D.D.D. Ma, C. S. Lee, F. C. K. Au, S. Y. Tong, and S. T. Lee, Small-Diameter Silicon Nanowire Surfaces, Science 299 (5614), 1874, (Mar. 21, 2003).*

Black et al., "Intersubband Transitions in Bismuth Nanowires," Applied Physics Letters, vol. 77, No. 25, pp. 4142-4144, 2000.

Li et al., "Nanowire Devices and Methods of Fabrication," US Pub. No. 2003/018920 A1, Pub. Date Oct. 9, 2003.

Lin et al., "Transport Properties of Bi Nanowire Arrays," Applied Physics Letters, vol. 76, No. 26, Jun. 2000.

Lique et al., "Increasing the Efficiency of Ideal Solar Cells by Photon Induced Transitions at Intermediate Levels," Phys. Rev. Lett., 78, 26, pp. 5014-5017, Jun. 1997.

Ruda et al., "Polarization-Sensitive Optical Phenomena in Semiconducting and Metallic Nanowires," Physical Review B, 72, pp. 115308, 2005.

* cited by examiner

OPTOELECTRONIC DEVICES UTILIZING MATERIALS HAVING ENHANCED ELECTRONIC TRANSITIONS

RELATED APPLICATIONS

This application claims the benefit of U.S. patent application Ser. No. 11/712,128, filed Feb. 27, 2007, which in turn claims the benefit of U.S. Provisional application Ser. No. 60/777,131 filed Feb. 27, 2006.

STATEMENT REGARDING FEDERAL RIGHTS

This invention was made with government support under Contract No. DE-AC51-06NA25396, awarded by the U.S. Department of Energy. The government has certain rights in the invention.

BACKGROUND OF INVENTION

The invention relates to optical materials and devices. More particularly, the invention relates to optical materials and devices in which interfacial mixing of electronic states occurs. Even more particularly, the invention relates to nano-wires comprising such optical materials.

Optoelectronic devices such as solar cells, radiation detectors, and light emitting diodes, generally depend upon bulk effects of semiconducting materials. Under such conditions, a single band-gap is accessible, and the overall efficiency of such devices is thereby limited to an upper value. In other applications, such as radiation detectors or light emitting diodes, the band-gap determines the energy of either emission or detection. Solar cells having a single band-gap, for example, are limited to an efficiency of less than about 41 percent.

The concept of increasing efficiency using intermediate band-gap materials has been proposed. Approaches to obtaining such materials include providing an intermediate band by incorporating quantum dots inside a host material.

Intermediate band-gaps are inaccessible in the bulk state. Attempts to fabricate devices utilizing intermediate band-gap materials require complex material assembly techniques and have to date been generally unsuccessful. Therefore, what is needed is an optoelectronic device comprising an intermediate band-gap material.

SUMMARY OF INVENTION

The present invention meets these and other needs by providing an optoelectronic device in which electronic transitions that are considered to be weak in bulk materials are intentionally enhanced. These electronic states are accessed by mixing electronic states at an interface that may be formed in a nano-well, a nano-dot, or a nano-wire. In one embodiment, the optoelectronic device comprises an intermediate band-gap material.

Accordingly, one aspect of the invention is to provide an optoelectronic device. The device comprises: a transparent conductor; a solid conductor; and a material disposed between the transparent conductor and the solid conductor such that at least a portion of the material is in electrical contact with the transparent conductor and the solid conductor. The material comprises a material having a Fermi energy level. The material has mixed electronic states at an interface and a plurality of carrier pockets comprising an initial state that is below or within kT of the Fermi energy level and a second state that is greater than or within kT of the Fermi energy level, where k is the Boltzmann constant and T is temperature in degrees Kelvin. The material has a predetermined disruption of symmetry at the interface.

A second aspect of the invention is to provide a material having enhanced electronic transitions. The material has a Fermi energy level. The intermediate band-gap material has mixed electronic states at an interface and a plurality of carrier pockets comprising an initial state that is below or within kT of the Fermi energy level and a second state that is greater than or within kT of the Fermi energy level, where k is the Boltzmann constant and T is temperature in degrees Kelvin. The intermediate band-gap material has a predetermined disruption of symmetry at the interface.

A third aspect of the invention is to provide an optoelectronic device. The optoelectronic device comprises: a transparent conductor; a solid conductor; and a plurality of nano-wires disposed between the transparent conductor and the solid conductor such that at least a portion of the plurality of nano-wires is in electrical contact with the transparent conductor and the solid conductor. The plurality of nano-wires comprises a material having enhanced electronic transitions. The material has a Fermi energy level, mixed electronic states at an interface, and a plurality of carrier pockets comprising an initial state that is below or within kT of the Fermi energy level and a second state that is greater than or within kT of the Fermi energy level, wherein k is the Boltzmann constant and T is temperature in degrees Kelvin. The material has a predetermined disruption of symmetry at the interface, and each of the plurality of nano-wires has a direction in a predetermined crystallographic orientation.

These and other aspects, advantages, and salient features of the present invention will become apparent from the following detailed description, the accompanying drawings, and the appended claims.

DETAILED DESCRIPTION

Figure 1:
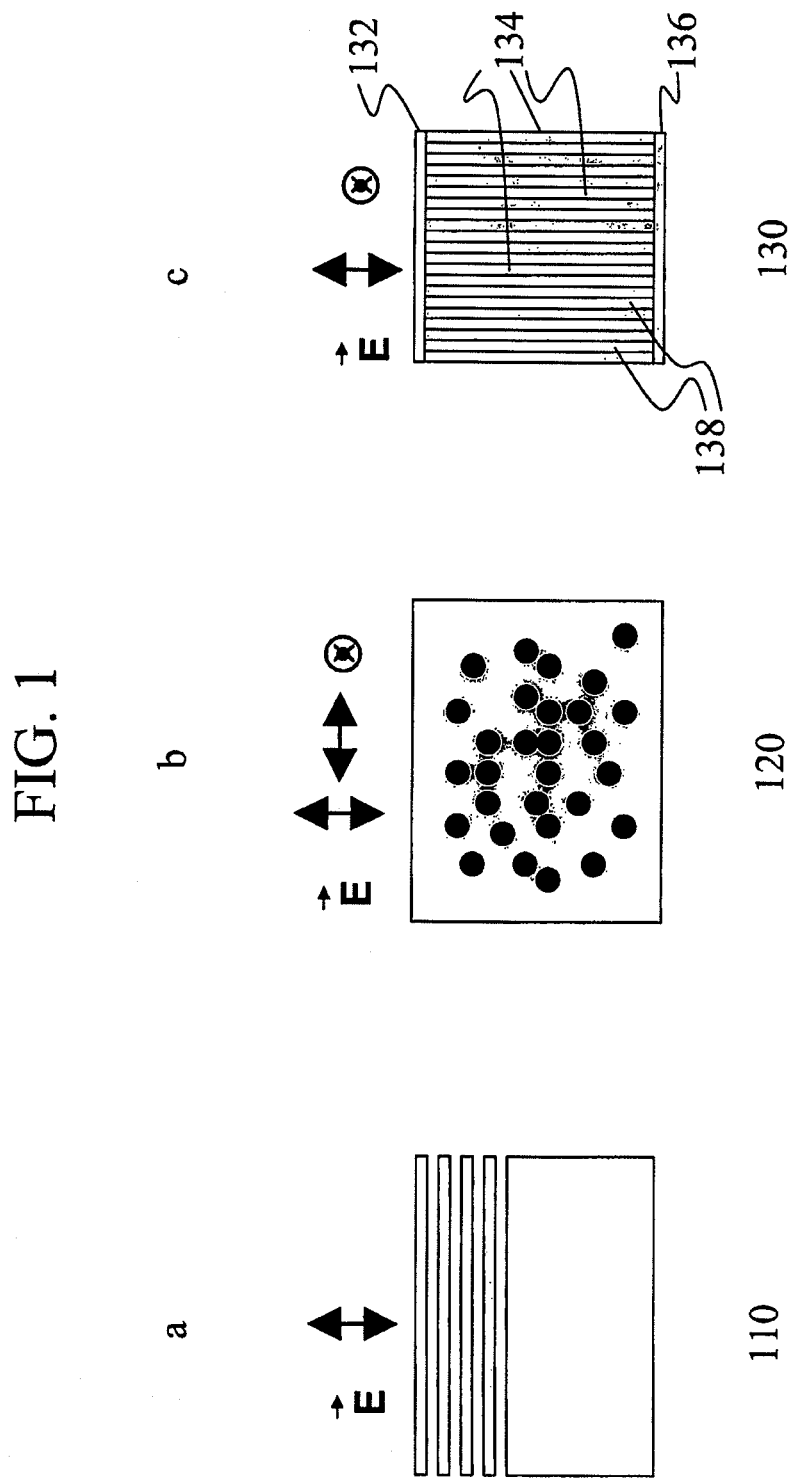
FIG. 1 is a schematic representation of: a) nano-well; b) nano-dot; and c) nano-wire structures, showing the direction of the electric field that will induce mixing of states due to surface effects.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general, it will be understood that the illustrations are for the purpose of describing particular embodiments and features of the invention and are not intended to limit the invention thereto.

In an intermediate band-gap photovoltaic device or an intermediate band-gap material, an intermediate band may serve to capture sub-band-gap radiation, thereby increasing the range of energies of photons that produce a photocurrent.

If free carriers live long enough in the intermediate level, a second photon can then excite the electron from the intermediate level to the band edge, thus increasing current with little or no loss to the open current voltage. Based on calculations proposed by A. Luque et al. ("Increasing the Efficiency of Ideal Solar Cells by Photon Induced Transitions at Intermediate levels", Phys. Rev. Lett. 78(26) (1997) pp. 5014-5017) and incorporated by reference herein, a maximum efficiency of about 63% may be obtained by using the intermediate band. A band-gap of 1.95 eV and a defect level at either 0.71 eV or 1.24 eV is needed to achieve such efficiency. Efficiencies of greater than about 60% can be achieved, however, for a wide range of band-gaps.

Nano-structured materials offer the opportunity of enhancing otherwise weak electronic transitions, thus allowing for more freedom in the design of detectors, emitters, and solar cells. For other types of optoelelectronic devices such as emitters and detectors, new emission or detection energies are made accessible by mixing electronic states. By enhancing selected electronic transitions, the present invention provides emitters and detectors for wavelengths in the mid- and far-infrared (about 10 μm); blue and near UV (about 310-420 nm); and red (about 550-700 nm).

The new approach to intermediate band gap solar cells, as described herein, utilizes mixing of electronic states at an interface. A model for the mixing of states is first proposed. Conclusions drawn from the model are then applied to the design of an intermediate band solar cell. Although the following model is helpful in explaining or describing the invention, the inventors do not wish to be bound to one such explanation. Accordingly, it is understood that other models or theories may be equally applicable.

As used herein, the term "interface" refers to any interruption in crystalline order. Examples of such interfaces include, but are not limited to, interfaces between crystalline planes, grain boundaries, phase boundaries, including interfaces between different crystalline phases, crystalline and amorphous materials, solid and gaseous phases, solid and liquid phases, and the like.

At a heterojunction, the periodic boundary conditions break down. In bulk materials, electronic wave functions with different momentum values are orthogonal such that, in the simplistic one-dimensional (also referred to herein as "1-D") case, $$\int_{-\infty}^{\infty} \Psi_1(x)\Psi_2(x)dx = 0. \quad (1)$$

$\Psi_1(x)$ and $\Psi_2(x)$ are the time independent electronic wave functions and are products of the Bloch ($u_{nk}(x)$) and envelope ($e^{ikx}$) functions, so that $$\Psi(x) = e^{ikx} u_{nK}(x). \quad (2)$$

However, when the lattice becomes finite, equation (1) is no longer valid, and different wave functions can no longer be assumed to be orthogonal. The spatial overlap (V) between the wave functions then becomes $$V = \int_0^{Na} e^{ik'_1 \cdot x} u_{nK_1}(x) e^{ik'_2 \cdot x} u_{nK_2}(x) dx, \quad (3)$$

where N is the number of atomic lattices in the structure, and a is the lattice constant in the direction of $\hat{x}$. In equation (3), k'=k+K for both states 1 and 2, where k is the crystal lattice momentum and K is the reciprocal lattice vector. For N<∞, the integral in equation (3) can be non-zero, reflecting the breakdown of the orthogonality of the wave functions with decreasing dimensions.

When calculating the overlap values of the 1-D finite lattice at the zone boundary and at the zone center, the eigenfunctions for the electronic wave functions are cosines and sines. Calculating the overlap function of two states leads to three possible combinations of sines and cosines: both wave functions are cosines; both wave functions are sines; and one wave function is a sine and one wave function is a cosine. These three combinations of wave functions lead to the overlap values of $$V = \int_0^{Na} \sqrt{\frac{2}{Na}} \cos((K_1+k_1)x) \sqrt{\frac{2}{Na}} \cos((K_2+k_2)x) dx = \quad (4)$$

$$\frac{2}{Na} \left[ \begin{array}{c} Na \\ 0 \end{array} \frac{\sin((K_1-K_2+k_1-k_2)x)}{2(K_1-K_2+k_1-k_2)} + \frac{\sin((K_1+K_2+k_1+k_2)x)}{2(K_1+K_2+k_1+k_2)} \right],$$

$$V = \int_0^{Na} \sqrt{\frac{2}{Na}} \sin((K_1+k_1)x) \sqrt{\frac{2}{Na}} \sin((K_2+k_2)x) dx = \quad (5)$$

$$\frac{2}{Na} \left[ \begin{array}{c} Na \\ 0 \end{array} \frac{\sin((K_1-K_2+k_1-k_2)x)}{2(K_1-K_2+k_1-k_2)} - \frac{\sin((K_1+K_2+k_1+k_2)x)}{2(K_1+K_2+k_1+k_2)} \right],$$

or $$V = \int_0^{Na} \sqrt{\frac{2}{Na}} \sin((K_1+k_1)x) \sqrt{\frac{2}{Na}} \cos((K_2+k_2)x) dx = \quad (6)$$

$$\frac{2}{Na} \left[ \begin{array}{c} Na \\ 0 \end{array} -\frac{\cos((K_1-K_2+k_1-k_2)x)}{2(K_1-K_2+k_1-k_2)} - \frac{\cos((K_1+K_2+k_1+k_2)x)}{2(K_1+K_2+k_1+k_2)} \right].$$

$$\sqrt{\frac{2}{Na}}$$

is the normalization factor of the wave functions for K+k=k'≠0.

At the Brillouin zone center (k=0) and at the Brillouin zone edges $$\left( k = \pm \frac{\pi}{a} \right)$$

the sine terms in equations (4) and (5) are all 0, and the overlap is 0. Hence, when the initial and final states are both at the zone boundary or the zone center and are both sines or both cosines, the orthogonality assumption remains valid, and no additional coupling is introduced at the interface. However, when one wave function is a sine and the other is a cosine, the overlap functions can be significant. In the dispersion relation of a simple material, when two electronic bands cross at the zone edge or the zone center, the degeneracy is split and the larger of the two energy bands is a cosine, while the smaller energy band is a sine. These pairs of bands can occur at the band edge or at the band center. This generalization is an oversimplification, as in real materials the complex geometry mixes the two states. However, the calculation indicates that if the initial state is the larger energy of a band pair, then the states it will couple most strongly to (due to mixing of states at the surface) are states that have the smaller energy of a band pair.

Because $K_1$ and $K_2$ are both multiples of 2π/a, their value will not change the value of the cosine terms in equation (6). Furthermore, when the structure has an even number of atoms, a is even, and the cosine terms will always be 1.

Therefore, if the structure has an even number of atoms, the value of the expression inside the brackets in equation (6) will be the same when x=0 and x=Na. Hence the overlap will be 0 when the structure has an even number of atoms.

When the structure has an odd number of atoms (a is odd) and both the wave functions are either at the zone boundary or at the zone center, $k'_1-k'_2$ is a multiple of $$\frac{2\pi}{a}.$$

Hence, the cosine terms in equation (6) are both 1, and the integral in equation (6) will be 0, which means that the states will not have enhanced coupling. However, when the structure has an odd number of atoms and either the initial or finial state is at the zone center and the other state is at the zone boundary, the cosine terms in equation will be −1 for x=Na, and 1 for x=0. Hence, if a is odd and one wave function is at the zone center and one is at the zone boundary, the spatial overlap between the electronic state calculated by equation (6) is non-zero. In summary of this model, additional coupling exists for initial and final states at the zone boundaries or the zone edge only in the case in which 1) either the initial or final state is a sine and the other state is a cosine, 2) the number of atoms in the structure is odd, and 3) one wave function is at the zone boundary and one is at the zone center. These conclusions are only for high symmetry points—i.e., states at the zone center or the zone boundary.

In three dimensions, the situation is similar, but more complicated. For example, surface reconstruction needs to be considered. In addition, this simple calculation uses the infinite boundary assumption, which leads to no wave function probability outside the crystal lattice and no coupling to the material on the other side of the interface. Both the 1-D and infinite boundary assumptions are not representative of a true crystal, but much intuition can be gained by looking at this simplified model.

For an odd number of atoms, and with one wave function at the zone center and one at the zone boundary, equation (6) can be simplified to $$V = \frac{2}{Na}\left(-\frac{1}{K_1-K_2+k_1-k_2} - \frac{1}{K_1+K_2+k_1+k_2}\right). \quad (7)$$

Substituting $$m_1 = k'_1\frac{a}{\pi} \text{ and } m_2 = k'_2\frac{a}{\pi}$$

leads to $$V = \frac{2}{N\pi}\left(-\frac{1}{m_1-m_2} - \frac{1}{m_1+m_2}\right). \quad (8)$$

Spatial overlap values for initial states with momentum values of $m_1=-1,0, 1$, and 13 were calculated from equation (8). When $m_1-m_2$ is even, the overlap is 0, indicating that if both states are at the zone center, or both are at the zone edge, no additional coupling is induced because of the finite lattice. Furthermore, the states with the largest overlap, and hence the largest additional coupling due to surface effects, have momentum values that differ by only π/a. The breakdown of the orthogonality assumption can be significant. In particular, as the difference between $m_1$ and $m_2$ decreases to 1, the spatial overlap of the wave functions increases and becomes as large as 0.85/N. This can also be seen from the first term in equation (8), which is only dependent on $m_1-m_2$, and hence when $m_1-m_2=1$, this term is maximized. The case of $m_1=m_2$ was not calculated, because it is the trivial case of the overlap of a state with itself.

These calculations also show that the overlap values for even $m_1-m_2$ states are 0. Hence, as previously mentioned, states only couple if one state is at the band center and the other state is at the band edge. Furthermore, with increasing values of $m_1$, the maximum value of the overlap decreases. As the state number is increased, the overlap value for $|m_1-m_2|=1$ converges to a value of $$\frac{2}{\pi}\frac{1}{N}.$$

In this limit, the first term in equation (7) dominates and the second term approaches 0. Depending on if the state with the larger k' value is a sine or a cosine function, the second term in equation (7) either adds or subtracts to the value of the first term. High order bands, therefore, will have less difference between sine and cosine terms, but will still have significant coupling between states with momentum differences of $$\frac{\pi}{a}.$$

For nanostructures, the breakdown of orthogonality of the wave functions becomes significant. Silicon quantum dots, for example, have a diameter on the order of 5 nm. With a lattice constant of 5.43 A, this corresponds to approximately 7-9 atoms across, depending on the direction. Using this as a basis in conjunction with the model described herein, the overlap between electronic wave functions from the gamma (Γ) valence band ($5^{th}$ band, $m_1=10$) to the Brillouin zone edge conduction band ($6^{th}$ band, $m_2=11$) is calculated from equation (8) to be 7% for 9 atoms and 9% for 7 atoms.

In order to see quantum confinement effects, a quantum dot, well, or wire must have dimensions less than or on the order of both the de Broglie wavelength and the mean free path of the free carriers (or in some cases excitons). However, in order to have significant mixing of bands at an interface requires only a large surface area to volume ratio, and does not require quantum confinement effects. Therefore, the only length scale requirement is the mean free path. Hence, the dimensions of the material can be larger than the de Broglie wavelength. The de Broglie wavelength is determined by the effective mass of the free carriers, which is deduced from the E vs. k relationship of the electronic energy bands. The mean free path depends on the material and the band of interest, as well as the defects, dopants, and temperature. In many materials, the mean free path is on the order of microns, while the de Broglie length scale is usually in the tens of angstroms range and can be as high as around 500 A in materials with very small effective masses. Hence, utilizing this surface effect does not necessarily require dimensions as small as those effects resulting from quantum confinement. This point is critical for photovoltaic applications, as the cost of the cell increases when the dimensions of the device decrease.

The mixing of states at a surface has many implications and the potential to impact many different applications. Accordingly, the invention provides a nano-wire solar cell that utilizes this effect to essentially create a double band gap material and thus increase the theoretical maximum photovoltaic efficiency.

An intermediate band solar cell can be designed by utilizing the mixing of bulk states at an interface. In the design of an intermediate solar cell several aspects need to be considered.

First, in order to utilize the mixing of bulk band states at an interface, the electric field of the incident light needs to be perpendicular to an interface. The mixing of electronic states at the surface will only occur for those states with a momentum component perpendicular to the surface. For electronic states parallel to the surface, the infinite lattice approximation remains valid, and therefore the states remain orthogonal, and the bulk states remain good eigenvectors. For nano-wells 110 grown using traditional methods, the quantum direction is perpendicular to the sample plane. Light therefore needs to be incident from the side of nano-well 110, as shown in FIG. 1a. Thus, the nano-well 110 sample has both has a small cross sectional area for absorption and band mixing only for photons incident with the electric field in one direction (FIG. 1a). In nano-dots 120, shown in FIG. 1b, the electric field will always be perpendicular to an interface. Photovoltaic devices, however, require conduction between a top electrode and a bottom electrode. Nano-dots 120 have the disadvantage that conduction takes place through tunneling or hopping. Hence, the free carrier mobility in nano-dots 120 is lower. Aligned nano-wires (FIG. 1c), on the other hand, satisfy both the requirement of a continuous conduction path and have all the incident photons with an electric field perpendicular to an interface.

An optoelectronic device 130, such as a solar cell, LED, or the like, comprising a plurality of nano-wires 134 is schematically shown in FIG. 1c. Aligned nano-wires 134 are disposed between a transparent conductor 132 and a solid conductor 136. Transparent conductor 132 and solid conductor 136 are formed from materials that are known in the art. An insulating material 138 such as, for example, alumina, may be disposed between nano-wires 134.

In the case of nano-wires, even though, for normal incident light, the electric field of the photons is always perpendicular to an interface, only very specific surface directions will enhance the desired mixing of bands. Hence, the orientation of the wires needs to be optimized. This aspect is discussed below.

The material from which an intermediate band solar cell is formed also needs to be considered. In addition to processing and cost issues, a material in which both the conduction and intermediate band edges have acceptable energies should be chosen. That is, the energies of the intermediate band and the conduction band (relative to the valence band) have to be a combination in which high efficiencies can be obtained. Furthermore, a material in which the electronic energy bands of interest either do not have non-radiative recombination routes, or at least only very slow recombination routes, should be selected. For example, a saddle point in the E vs. k diagram could not be used as an intermediate band. Although this requirement immediately rules out some materials, only experimental evidence can conclusively prove the absence of non-radiative recombination routes.

One material in which the energy levels are close to ideal for an intermediate band solar cell is silicon. In addition, the energy bands of interest in silicon do not have obvious non-radiative recombination routes between them. The gamma (Γ) to delta (Δ) indirect band-gap of silicon is 1.17 eV, whereas the r to L point transition is between about 1.65 eV and about 2.29 eV.

In order to minimize the percentage of high-energy photons absorbed in the lower energy band-gap, the wire diameter must be small enough so that the absorption above the energy of the larger band-gap is dominated by the higher energy band. This enhancement of the higher energy band absorption will ensure that photons having energies greater than the larger of the two band-gaps will be absorbed into the high-energy band rather than the lower energy band, where the excess energy will be lost to radiation.

Electrons (or holes) that are more than one mean free path away from the surface will not "see" the surface, and therefore will not experience the mixing of bulk states. The absorption coefficient will therefore simply be the bulk value at distances greater than a mean free path away from the surface. For light with the electric field perpendicular to the surface, the effective absorption coefficient can be approximated by a weighted sum of the surface and bulk absorption coefficients. For a 1-D surface (nano-well) the estimated effective absorption coefficient is found by the integral $$A_{tot}(\omega) = \frac{A_{bulk}(\omega)d + \int_0^d A_{surface}(\omega)\exp\left(\frac{-x}{MFP}\right)dx}{d}, \quad (9)$$

where $A_{tot}(\omega)$, $A_{bulk}(\omega)$, and $A_{surface}(\omega)$ are the effective, bulk, and surface absorption coefficients, respectively, MFP is the mean free path of the free carriers, and d is the thickness of the material.

The wire diameter required to sufficiently enhance the optical absorption from the high-energy band can be determined by equation (9). However, the mean free path of the higher order band, the absorption (related by the coupling) of the higher energy band in bulk, and possibly the mixing of the two states at an interface are usually unknown. Therefore, the wire diameter threshold will most likely need to be determined experimentally with guidance from theory.

The direction of nano-wire 134 must also be carefully chosen. As used herein, the direction of nano-wire 134 refers to the crystallographic orientation of nano-wire 134 along its major axis (i.e., length). In an intermediate band solar cell, the absorption of the larger energy band transition should be much stronger than the absorption coefficients of the two smaller energy band transitions when the absorption coefficients of the different band transitions overlap. Hence, it is desirable to enhance the absorption of the larger energy band transition (i.e., the valence band to conduction band transition) and not enhance the absorption of the smaller energy band transitions (i.e., the valence band to intermediate band and intermediate band to conduction band transitions).

In the case of silicon, the Γ-point valence band to L-point conduction band electronic transition needs to be enhanced. The Γ-point is <000> in the Brillouin zone, whereas the L-point is four fold degenerate with electron pockets in the <111>, <-111>, <1-11>, and <11-1> crystallographic directions. In order for the surface of the nano-wire 334 to break the symmetry requirements of this transition, the surface normal must be parallel to a vector in the direction of the difference between the directions of the two high symmetry points. For silicon, this means that the nano-wire 334 direction must be perpendicular to either the <111>, <-111>, <1-11>, or the <11-1> crystallographic directions. For a wire having its major axis or length in the <hkl> crystallographic orientation, either h+k+l=0, −h+k+l=0, h−k+l=0, or h+k−l=0. In addition, the nano-wire 334 should not be perpendicular to the direction of the difference between the Γ-point and the Δ-point so as to not enhance the electronic transition from the Γ-point valence band to the Δ-point intermediate band. Thus, the nano-wire 340 should not be perpendicular to the <100>, <010>, and <001> crystallographic directions, which corresponds to the case where h≠0, k≠0, and l≠0. These two requirements also ensure that the intermediate band to conduction band is not enhanced, as demonstrated by the equations:

$$\vec{W}\cdot(\vec{V}-\vec{C})=0 \qquad (10a)$$

$$\vec{W}\cdot(\vec{V}-\vec{I})\neq 0 \qquad (10b)$$

$$\vec{W}\cdot(\vec{C}-\vec{I})=\vec{W}\cdot((\vec{V}-\vec{I})-(\vec{V}-\vec{C}))=\vec{W}\cdot(\vec{V}-\vec{I})\neq 0, \qquad (10c)$$

where $\vec{W}$ is the vector in the direction of the wire axis, and $\vec{V}$, $\vec{C}$, and $\vec{I}$ are the vectors in the directions of the valence, conduction, and intermediate electronic pockets respectively. Equation (10a), expresses the condition that the wire axis direction is perpendicular to the direction of the difference between the valence and conduction bands. Equation (10b) expresses the condition that the wire axis direction is not perpendicular to the difference between the valence and intermediate bands. Equation (10c) shows that, given equations (10a) and (10b), the axis direction of nano-wire 334 must also not be perpendicular to the difference of the valence and intermediate bands. Examples of silicon nano-wire directions that meet these requirements include the <1-21>, <211>, <121>, and <112> directions. It should be noted that only one of the four Γ-point to L-point transitions are enhanced for a given wire direction.

The invention explores a mechanism for enhancing the coupling of indirect transitions by forming a material with a large surface area. The enhancement is due to the breakdown of the orthogonality assumption routinely used to derive the E vs. k diagrams. The dimensions required to observe this effect are determined by the mean free path, unlike quantum effects, which are determined by the minimum of the mean free path and the de Broglie wavelength. Hence, this effect does not necessarily require nanostructured materials with dimensions as small as that required for quantum confinement effects. A model of this mechanism shows that when either the initial or the final state is a sine and the other state is a cosine, the number of atoms in the direction of a surface is odd, and one electronic state is at the zone boundary and the other state is at the zone center, the coupling between the bands is enhanced. The enhancement is only for photons having a component of the electric field perpendicular to the surface and those electronic transitions in which the direction of the surface allows for coupling. The enhancement is maximized for initial and final states with a difference in k' of $$\pm\frac{\pi}{a}.$$

The enhancement of absorption due to the mixing of states is then applied to photovoltaics. Utilizing the mixing of bands at an interface, an intermediate band-gap solar cell, shown in FIG. 1c, is designed. The device includes nano-wires 340 aligned in the <121> direction. Nano-wires 340 comprise silicon.

The following predictive examples illustrate the features and advantages of the invention and are in no way intended to limit the invention thereto.

EXAMPLE 1

Mid-IR Detector or Emitter Using Bismuth

Figure 2A:
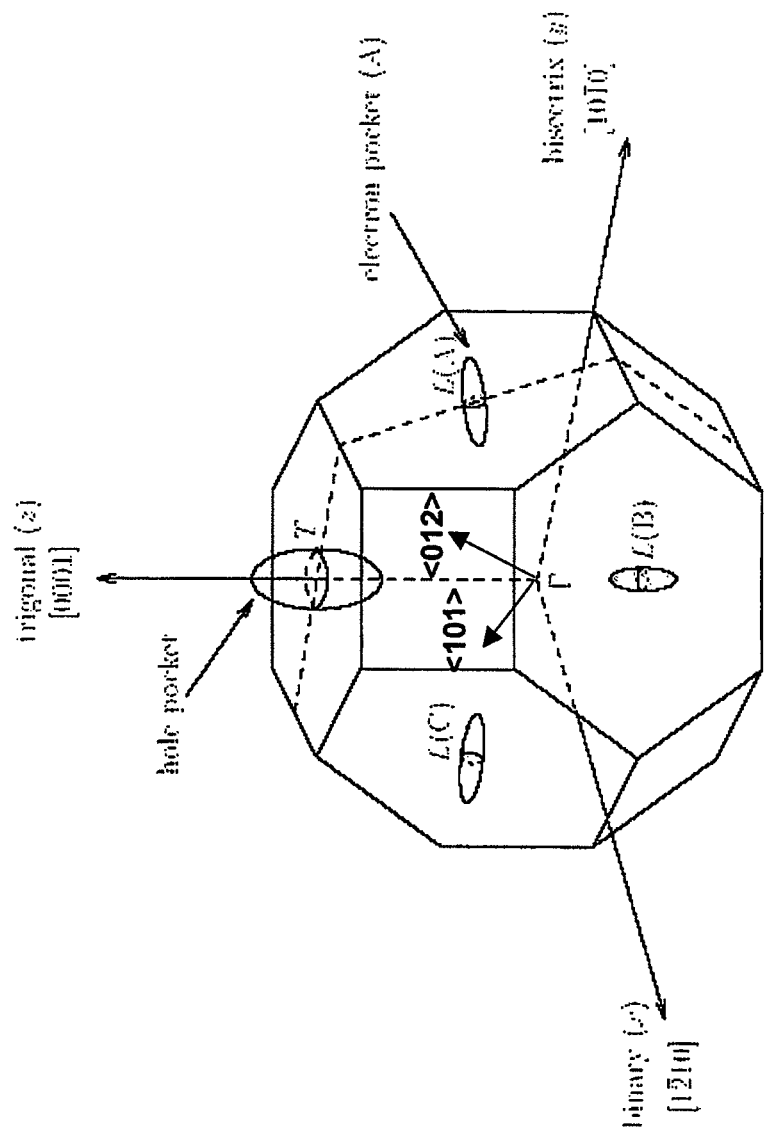
FIG. 2 is a schematic representation of: a) T valence band, $\Gamma$ band, and <012> orientation in bismuth; and b) the electronic band structure of bismuth.
Figure 2B:
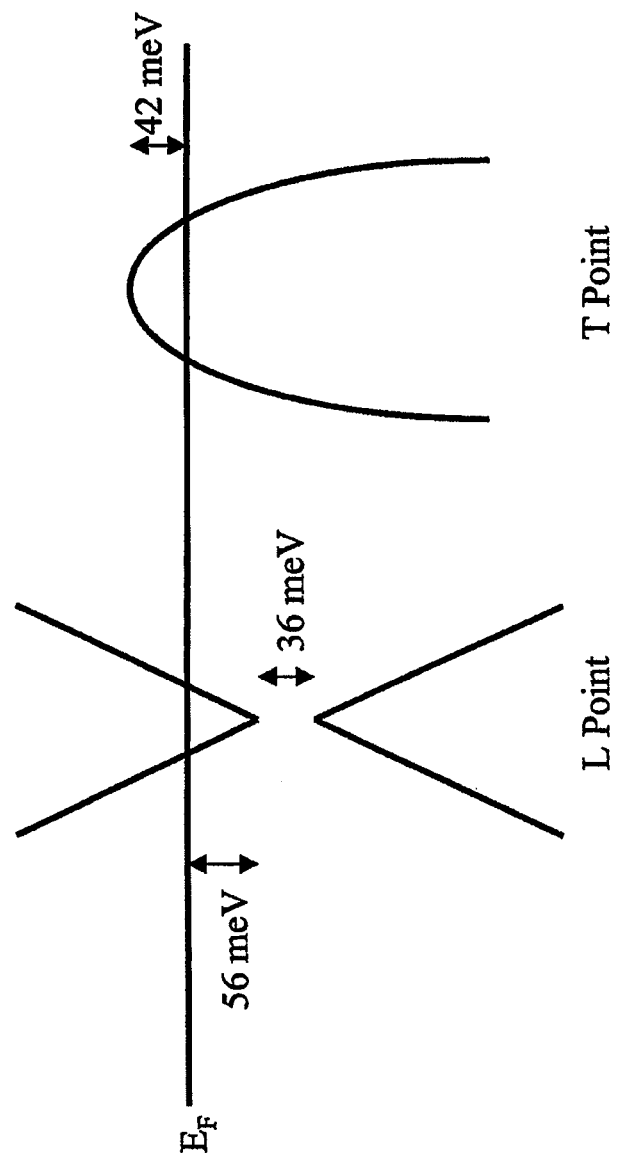

Bismuth is a narrow band gap semi-metal with a very unusual band structure, which is shown in FIG. 2b. The T point valence band crosses the Fermi energy ($E_F$) so the band edge is above the Fermi energy leaving lots of empty electron states (holes). The L point valence band edge is below the Fermi energy and is therefore mostly filled with electrons. Because both of these states are curved in the same direction (as opposed to a valence and conduction band pairs), the joint density of states is large. Furthermore, because there is a hole pocket at the T point and an electron pocket at the L point, many electrons can be excited from the L point valence band to the T point valence band. In bulk bismuth, however, this transition, which is predicted to be around 0.13 eV at room temperature, is indirect and weak.

In bismuth nano-wires, the symmetry arguments break down and the L to T point transition becomes allowed. Hence, bismuth nano-wires have a very large and intense optical absorption resulting from the excitation of electrons at the L point to holes at the T point. This strong and narrow absorption is observed at 0.12 eV in nano-wires with <101> and <012> orientations (FIG. 2a). Both of these wire directions have interfaces perpendicular to the T-L direction. The L and T point directions are <111>, <−111>, <1-11>, and <11-1>, with one of these directions being the T point direction and the other three being L point directions. The choice for the T point is arbitrary. For example, <111>−<−111>=<200>, which is perpendicular to the wire orientation <012>. As another example, <111>−<1-11>=<020>, which is perpendicular to the wire direction <101>. Hence, both wire directions <101> and <012> should couple the L and T point.

The strong coupling between the L and T points may be used as a method to produce a mid IR detector or emitter. Only the strong absorption was measured in bismuth nano-wires, whereas the luminescence and photo conductance has not yet been investigated. However, it is likely that bismuth nano-wires will also luminesce as a result of the L to T electronic transition and be useful in light emitting applications. The emission energy is expected near the 0.12 eV (10 μm) absorption peak, which is an important wavelength for environmental monitoring. In order to create vacancies at the lower energy state (L-point valence band), however, the device will likely have to be pumped to excite electrons from the L point valence band to the L point conduction band.

Nano-wires have been previously made by electrochemically filling porous anodic alumina and a pressure injection technique. Because the absorption peak at 0.12 eV has been observed for nano-wires with a diameter as large as 200 nm, and because the wire diameter distribution can be large, easier fabrication techniques could be used. Anodic alumina templates, for example, can be purchased with pore sizes between 200 and 50 nm. In addition, standard lithography techniques could be used to make arrays of bismuth nano-wires.

As with all of the examples given here, arrays of nano-wires aligned in a specific direction, with a transparent top conductive contact 332 and a conductive back contact 336, are within the scope of the invention.

EXAMPLE 2

Red Emitter Using Silicon Nano-Wires that Utilize the Effect of Interface Mixing Numerous studies have looked into the photoluminescence in silicon quantum structures. These structures include amorphous silicon, which has been shown to contain quantum dots.

Several theories have been proposed to explain the photoluminescence between 550 nm and 700 nm observed for silicon, but none of the theories explain all the data. It is very likely that interface mixing enhances the coupling between the gamma (Γ) and L point and this transition is causing the observed photoluminescence. If this is indeed the cause, the ideal structure for maximizing this luminescence will comprise high purity silicon having interfaces in the <111> direction and only slight doping levels, as too high doping will decrease the diameter required to observe the photoluminescence.

EXAMPLE 3

Intermediate Band Solar Cell Using Silicon Nano-Wires Utilizing Interface Mixing One approach to fabricating intermediate band solar cells that has been proposed is sandwiching quantum dots between two semiconductors. Obtaining electrical contact to the quantum dots, however, is difficult. By utilizing interface mixing, a single material can be used to provide both levels in the intermediate band solar cell. The strength of coupling between the ground state and the two excited states can be optimized for solar cell efficiency by changing the orientation and diameter of nano-wires 134. Coincidentally, silicon has two band gaps that together are very near the optimal energies for an intermediate band solar cell. The smallest band gap is at 1.12 eV at the delta point in the X direction. Another carrier pocket exists at the L point and is predicted to be between 1.6 eV and 2.1 eV. Intermediate band gap solar cells with band gaps at 1.12 eV and 1.9 eV and having efficiencies of over 60% have been predicted, based on calculations.

To increase the coupling of the Γ to L point transition relative to the Γ to Δ, point transition, an interface would need to be perpendicular to the <111> (L) direction, and not in the <100> (X) direction. For a wire having its major axis or length in the <hkl> crystallographic orientation, either $h+k+l=0$, $-h+k+l=0$, $h-k+l=0$, or $h+k-l=0$, and $h\neq0$, $k\neq0$, and $l\neq0$. For example, a wire in the <11-2> direction would couple the Γ to L points and not the Γ to X points. As the diameter of the wire decreases, the coupling strength increases. Nano-particles having a nano-dimension of about 5 nm and smaller have been previously found to be needed for photoluminescence. However, the nano-particles consisted of doped samples in which dopants were separated by a distance of about 5 nm. It is possible that the dopants scattered the electrons and thus effectively shielded the electrons from the interface. By decreasing the doping levels or by using techniques such as delta doping, where the dopants are outside of the active area, the critical diameter could be increased to make fabrication easier. If the diameter does indeed need to be near 6 nm, other fabrication techniques, such as using metallic nano-dots as a mask and etching the silicon with a reactive ion etch, advanced e-beam lithography, electrochemically filling pores in anodic alumina, and the like may be employed.

EXAMPLE 4

Blue or Near UV Emitter from Zinc Nano-Wires

Figure 3:
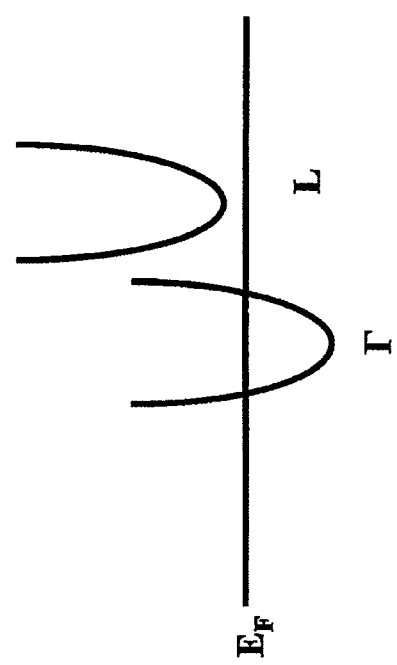
FIG. 3 is a schematic representation of the electronic band structure of zinc.

Zinc is a metal with a rather complicated electronic band structure. The relevant bands are shown in FIG. 3. Based on the band diagram shown in FIG. 3, the transition between the F conduction band to L point conduction band in nanostructured zinc would be expected to exhibit strong absorption and luminescence due to interface mixing. As in bismuth, both the initial and final states are curved in the same direction, thus forming a large density of states. Also like in bismuth, one of the bands crosses the Fermi energy ($E_F$) making lots of states available for this electronic exciton. In the case of zinc, the Γ point conduction band crosses the Fermi energy, which leaves the band edge full of electrons. The L-point conduction band is above the Fermi energy and is thus full of empty states for the electrons to be excited into. Again, the pockets are in the F and L point, so the interface needs to be in the <111> direction. The energy of this transition is about 3 eV. For a wire having its major axis or length in the <hkl> crystallographic orientation, either $h+k+l=0$, $-h+k+l=0$, $h-k+l=0$, or $h+k-l=0$, where $h\neq0$, $k\neq0$, and $l\neq0$.

Although it is unclear how small the zinc nanocrystals need to be to observe this effect, it is expected that the dimensions of the zinc nanocrystals would be more similar to those of bismuth than those of silicon, because both zinc and bismuth are metallic. Thus, the easier fabrication methods that have been previously described herein could be employed for a detector or an emitter.

Although the mixing of electronic states at interfaces has been described herein for silicon, bismuth, and zinc, other materials, such as zinc sulfide, indium phosphide, indium arsenide, and the like, are expected to exhibit similar behavior.

Although typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. An optoelectronic device, the device comprising: (a) a first conductor; (b) a second, solid conductor; and (c) a material disposed between the first conductor and the solid conductor such that at least a portion of the material is in electrical contact forming a continuous conduction path with the first conductor and the second, solid conductor, wherein the material has a Fermi energy level, a plurality of carrier pockets, and an interface, wherein significant mixing of electronic states is achieved at the interface resulting in mixed electronic states, wherein the mixed electronic states comprise an initial state that is below or within kT of the Fermi energy level and a second state that is greater than or within kT of the Fermi energy level, wherein k is the Boltzmann constant and T is temperature in degrees Kelvin.

2. The optoelectronic device according to claim 1, wherein the material comprises a plurality of nano-wires such that at least a portion of the plurality of nanowires is in electrical contact with the first conductor and the solid conductor.

3. The optoelectronic device according to claim 2, wherein each of the plurality of nano-wires has a diameter of up to about 200 nm.

4. The optoelectronic device according to claim 3, wherein each of the plurality of nano-wires has a diameter in a range from about 50 nm to about 200 nm.

5. The optoelectronic device according to claim 2, wherein each of the plurality of nano-wires has a crystallographic orientation <hkl>, wherein h+k+l=0, −h+k+l=0, h−k+l=0, or h+k−l=0, and wherein h≠0, k≠0, and l≠0.

6. The optoelectronic device according to claim 5, wherein the plurality of nano-wires comprises silicon nano-wires, and wherein each of the silicon nano-wires has a direction in a crystallographic orientation selected from the group consisting of <1-21>, <211>, <121>, and <112> orientations.

7. The optoelectronic device according to claim 2, wherein the plurality of nano-wires comprises bismuth nano-wires, and wherein each of the bismuth nanowires has a direction in a crystallographic orientation selected from the group consisting of <101> and <012> orientations.

8. The optoelectronic device according to claim 2, further comprising an insulating material disposed between the plurality of nano-wires.

9. The optoelectronic device according to claim 8, wherein the insulating material comprises alumina.

10. The optoelectronic device according to claim 1, wherein the material comprises a substance selected from the group consisting of silicon, bismuth, zinc, zinc sulfide, indium phosphide, indium arsenide, and combinations thereof.

11. The optoelectronic device according to claim 1, wherein the material comprises at least one nano-dot.

12. The optoelectronic device according to claim 1, wherein the material comprises at least one nano-well.

13. The optoelectronic device according to claim 1, wherein the optoelectronic device is one of a light emitting diode, an infrared detector, an emitter, a solar cell, and a photovoltaic cell.

14. The optoelectronic device according to claim 13, wherein the emitter is one of a near infrared emitter, a blue emitter, a red emitter, and a near UV emitter.

15. The optoelectronic device of claim 13, wherein the device is an intermediate band solar cell.

16. The optoelectronic device of claim 15, wherein the material comprises silicon, and the $\Gamma$ point valence band to L-point conduction band electronic transition is enhanced and lies between about 1.65 and 2.29 eV.

17. The optoelectronic device of claim 1, wherein the mixing of electronic states at the interface is such that the spatial overlap of two states is at least about 7 percent.

18. A method of manufacturing an optoelectronic device, wherein the method comprises the steps of (a) selecting a crystalline orientation for nano-wires which results in significant mixing of electronic states being achieved at a interface of the nano-wires, resulting in mixed electronic states, (b) fabricating a nanowire array having the selected crystalline orientation, (c) providing the nanowire array with a first conductor on one side of the nano-wire array and a solid conductor on a second side of the array, forming a continuous conduction path between the nanowire array and the first conductor and solid conductor respectively.

19. The method of claim 18, comprising the step of disposing an insulating material between the nanowires.

* * * * *